United States Patent
Rolfson et al.

(10) Patent No.: US 6,300,017 B1
(45) Date of Patent: Oct. 9, 2001

(54) STENCIL MASKS AND METHODS OF MANUFACTURING STENCIL MASKS

(75) Inventors: J. Brett Rolfson, Boise, ID (US); Ivan L. Berry, III, Ellicott City, MD (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/137,504

(22) Filed: Aug. 20, 1998

(51) Int. Cl.$^7$ .................................................. G03F 9/00
(52) U.S. Cl. .................................. 430/5; 378/34; 378/35
(58) Field of Search ........................ 430/5, 315; 438/518, 438/519, 521, 524, 527, 529; 378/34, 35

(56) References Cited

U.S. PATENT DOCUMENTS

| | | | |
|---|---|---|---|
| 4,013,502 | * | 3/1977 | Staples ................................. 156/608 |
| 4,448,865 | * | 5/1984 | Bohlen et al. ............................. 430/5 |
| 4,868,134 | * | 9/1989 | Kasahara ................................. 437/27 |
| 4,906,591 | * | 3/1990 | Okumura ................................. 438/252 |
| 5,032,534 | * | 7/1991 | Ducreuz ................................. 438/10 |
| 5,130,271 | * | 7/1992 | Migita ................................. 437/147 |
| 5,143,857 | * | 9/1992 | Finchem et al. ........................ 438/181 |
| 5,223,442 | * | 6/1993 | Kitagawa et al. ....................... 437/6 |
| 5,453,387 | * | 9/1995 | Hayashi ................................. 438/374 |
| 5,482,873 | * | 1/1996 | Yang ................................. 438/365 |
| 5,672,449 | * | 9/1997 | Loschner et al. ........................ 430/5 |
| 5,731,218 | * | 3/1998 | Melzner et al. ....................... 438/239 |
| 5,770,336 | * | 6/1998 | Choi ................................. 430/5 |
| 5,795,801 | * | 8/1998 | Lee ................................. 438/199 |
| 5,937,287 | * | 8/1999 | Gonzalez ................................. 438/220 |

* cited by examiner

Primary Examiner—Mark F. Huff
Assistant Examiner—Saleha R. Mohamedulla
(74) Attorney, Agent, or Firm—Wells, St. John, Roberts, Gregory, & Matkin, P.S.

(57) ABSTRACT

In one aspect, the invention encompasses a method of manufacturing a stencil mask comprising: a) defining a plurality of opening locations within a substrate; b) providing a dopant within the substrate, the dopant being provided in a pattern to form a plurality of first regions doped to a concentration with a dopant and one or more second regions not doped to the concentration with the dopant, individual first regions surrounding individual opening locations; c) forming a plurality of openings within the opening locations, the individual openings extending into the substrate; and d) forming a stencil mask from the substrate having the openings extending therein. In another aspect, the invention encompasses a stencil mask comprising: a) a substrate; b) a plurality of openings extending through the substrate; and c) a pattern of dopant within the substrate, the pattern comprising a plurality of first locations doped to a concentration with a dopant and one or more second locations not doped to the concentration with the dopant, individual first locations surrounding individual openings.

45 Claims, 5 Drawing Sheets

STENCIL MASKS AND METHODS OF MANUFACTURING STENCIL MASKS

TECHNICAL FIELD

The invention pertains to stencil masks, and to methods of manufacturing stencil masks.

BACKGROUND OF THE INVENTION

Ion and electron beam lithographic systems utilize a stencil mask to pattern a resist coated target. These stencil masks typically comprise a substrate and a pattern of openings formed through the substrate. Commonly the substrate will be formed of a semiconductive material, such as silicon. However, other deposited or grown materials, such as SiC, SiN and BN can also be used to form at least some of the substrate.

The formation of a patterned opening extending through substrates comprising silicon, SiC, SiN and/or BN can be quite challenging as such substrates are frequently thin and brittle. Accordingly, it would be desirable to develop alternative methods of forming and patterning openings in such substrates.

Additionally, it can be challenging to maintain the dimension of an opening formed in a thin substrate comprising silicon, SiC, SiN and/or BN, as the material around such openings tends to easily deform (i.e., warp, bow or otherwise alter its shape after formation of the openings). Such deformations can undesirably change the dimensions of the openings and thus alter a pattern of openings formed in a stencil mask substrate. Accordingly, it is desirable to develop methods of maintaining a pattern of openings within a stencil mask substrate.

Stencil masks are typically formed by either a wafer flow method, or a membrane flow method. In a wafer flow method, a full thickness wafer is processed to form a pattern of openings extending into the wafer. The wafer is then reduced in thickness (to a thickness of, for example, from about 2 microns to about 10 microns) to form a membrane. In a membrane flow process, a semiconductive material wafer is first reduced to about a thickness of a silicon membrane. The membrane is then processed to form a pattern of openings through the membrane.

SUMMARY OF THE INVENTION

In one aspect, the invention encompasses a method of manufacturing a stencil mask. A plurality of opening locations are defined within substrate. A dopant is provided within the substrate in a pattern which forms a plurality of first regions doped to a concentration with a dopant and one or more second regions not doped to the concentration with the dopant. Individual first regions surround individual opening locations. A plurality of openings is formed within the opening locations. The individual openings extend into the substrate. A stencil mask is formed from the substrate having the openings extending therein.

In another aspect, the invention encompasses a method of manufacturing a stencil mask from a semiconductive material. A patterned material is formed over the semiconductive material. The patterned material covers portions of the semiconductive material and leaves other portions uncovered. A first dopant is provided into the uncovered portions of the semiconductive material. The first dopant is driven beneath the patterned material. The uncovered portions of the semiconductive material are removed to form openings extending into, but not through, the semiconductive material, then additional semiconductive material is removed until the openings extend entirely through the semiconductive material.

In yet another aspect, the invention encompasses a stencil mask. The stencil mask includes a substrate having a plurality of openings extending through it. The stencil mask further includes a pattern of dopant within the substrate. The pattern comprises a plurality of first locations doped to a concentration with a dopant and one or more second locations not doped to the concentration with the dopant. Individual first locations surround individual openings.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
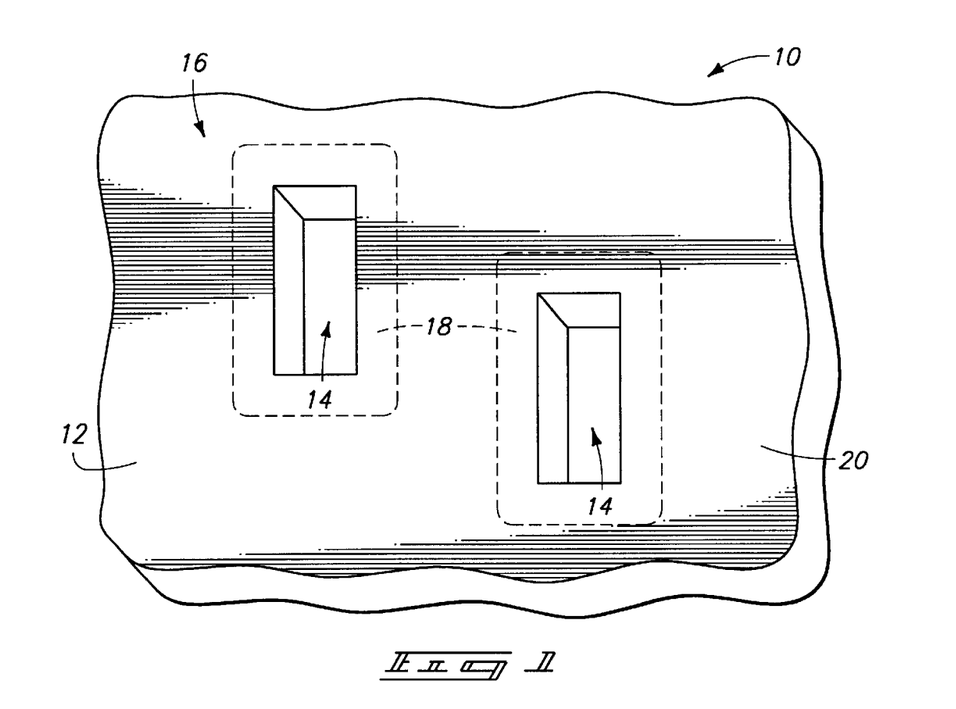
FIG. 1 is a fragmentary, isometric view of a stencil mask encompassed by the present invention.

FIG. 1 illustrates a stencil mask 10 encompassed by the present invention. Stencil mask 10 comprises a substrate 12 and a plurality of opening locations 14 extending through substrate 12. A pattern 16 of dopant is formed within substrate 12. Pattern 16 comprises a plurality of first locations 18 doped to a concentration with a dopant and a second location 20 not doped to the concentration with the dopant. First locations 18 surround individual openings 14. The concentration of the dopant within first locations 18 can be, for example, at least about $10^{17}$ atoms/cm$^3$. The concentration of the dopant with second location 20 can be, for example, less than about $10^{17}$ atoms/cm$^3$, and can be, for example, about 0 atoms/cm$^3$.

Substrate 12 can comprise a number of materials, including, for example, semiconductive materials, such as, monocrystalline silicon, SiN, SiC, and/or BN.

The dopants utilized to form first locations 18 can have atomic radii smaller than an atomic radii of the material of substrate 12, or atomic radii larger than the atomic radii of the material substrate 12. Dopants having atomic radii smaller than an atomic radii of the material will create a tensile force within the material, and dopants having atomic radii larger than that of the material will create compressive forces within the material. The forces created by the dopants can prevent structural deformations from occurring in the substrate adjacent openings 14, and can therefore aid in maintaining dimensions of openings 14. Among the deformations that can occur in the substrate are bowing of an opening's peripheries either inward to decrease a width of the opening or outward to increase a width of the opening. The force created by the dopants can prevent such bowing. Also, in circumstances in which the bowing has occurred before provision of the dopants at the periphery of the opening, the forces created by the dopants can force the substrate to unbow.

In a preferred embodiment of the present invention, two dopants will be provided in the individual first locations 18, with one of the dopants being smaller than the material of substrate 12, and the other of the dopants being larger than such material. The dopants will then create both tensile and compressive type forces within first locations 18, which can be balanced to maintain dimensions of openings 14. Example dopants for utilization when material 12 comprises, for example, monocrystalline silicon, are arsenic, boron and phosphorus. Atomic silicon has an atomic radii of 132 picometers, whereas arsenic, boron and phosphorous have atomic radii of 139 picometers, 98 picometers and 128 picometers, respectively. Accordingly, arsenic creates compressive forces within the silicon substrate, and boron and phosphorous create tensile forces.

Substrate 12 can comprise additional dopants beyond those specifically provided in first locations 18. For instance, if substrate 12 comprises monocrystalline silicon, the substrate can also comprise a background p-type dopant concentration of from about $10^{12}$ to about $10^{16}$ atoms/cm$^3$. The background dopant will be formed substantially uniformly throughout stencil mask 12, and will thus be in both first locations 18 and second locations 20.

Although the stencil mask fragment 10 comprises a first location 18 around each of the shown openings 14, the invention also encompasses embodiments (not shown) wherein first locations are provided around only some of the openings present in a stencil mask.

Figure 2:
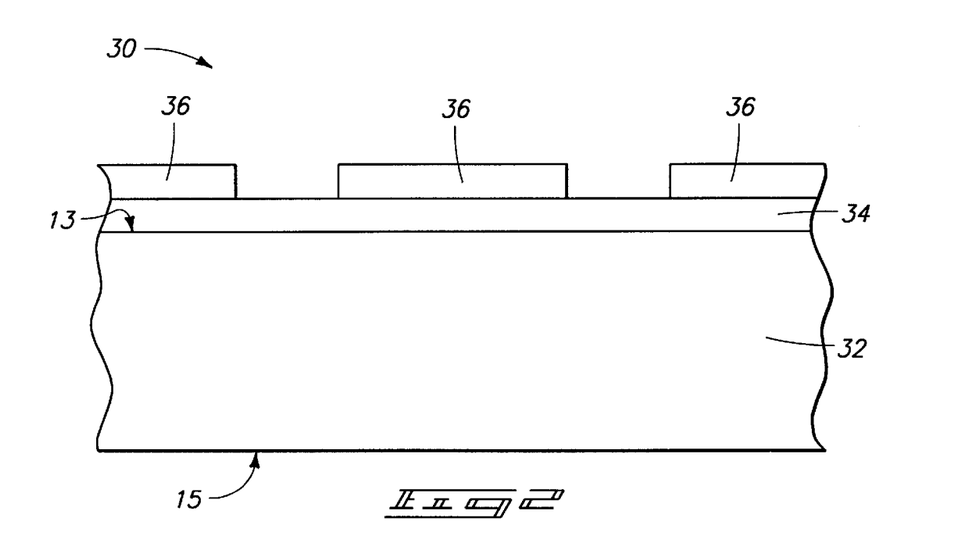
FIG. 2 is a diagrammatic, fragmentary, cross-sectional view of a semiconductor wafer fragment processed according to a method of the present invention.

A first embodiment method of manufacturing a stencil mask is described with reference to FIGS. 2–7, with FIG. 2 illustrating a semiconductive wafer fragment 30 at a preliminary processing step of the method.

Wafer fragment 30 comprises a substrate 32 having a top surface 13 and a bottom surface 15. A hard masking layer 34 is formed over substrate 32, and a patterned photoresist layer 36 is formed over masking layer 34.

Substrate 32 can comprise, for example, monocrystalline silicon lightly doped with a p-type dopant to a dopant concentration of from about $10^{12}$ to about $10^{16}$ atoms/cm$^3$. Masking layer 34 can comprise, for example, one or more layers comprising silicon dioxide, silicon nitride, or metals, such as, for example, tungsten.

Patterned photoresist layer 36 covers portions of masking material 34, while leaving other portions uncovered. The uncovered portions of masking material 34 are removed to form the patterned masking layer 34 shown in FIG. 3. In an example in which masking layer 34 comprises silicon dioxide, a method of removing portions of layer 34 is a plasma reactive ion etch, utilizing fluorine.

Figure 3:
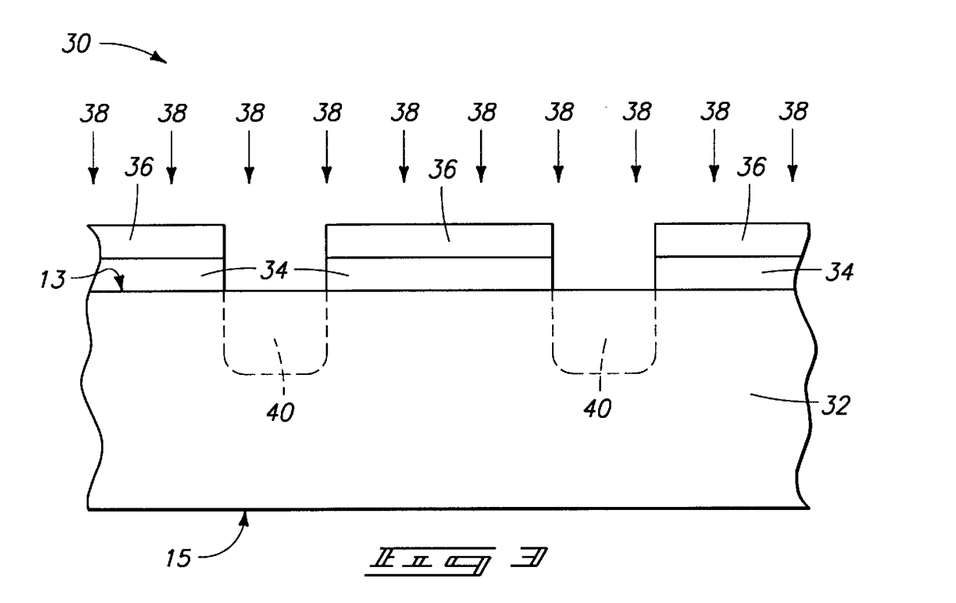
FIG. 3 is a view of the FIG. 2 wafer fragment at a processing step subsequent to that of FIG. 2.

Patterned masking layer 34 leaves portions of substrate 32 exposed. The exposed portions define locations in substrate 32 wherein openings will be formed. A dopant 38 is implanted into such locations to form first regions 40. First regions 40 can alternatively be referred to as doped regions 40, to indicate that the regions 40 comprise the dopant 38. Dopant 38 is preferably implanted to a concentration of at least about $10^{17}$ atoms/cm$^3$. Dopant 38 can comprise an n-type dopant, a p-type dopant, or a combination of n-type and p-type dopants. Also, dopant 38 can comprise a dopant having an atomic radii smaller than an atomic radii of the semiconductive material of substrate 32, an atomic radii larger than an atomic radii of such semiconductive material, or a combination of dopants having atomic radii both larger and smaller than the atomic radii of the semiconductive material.

Figure 4:
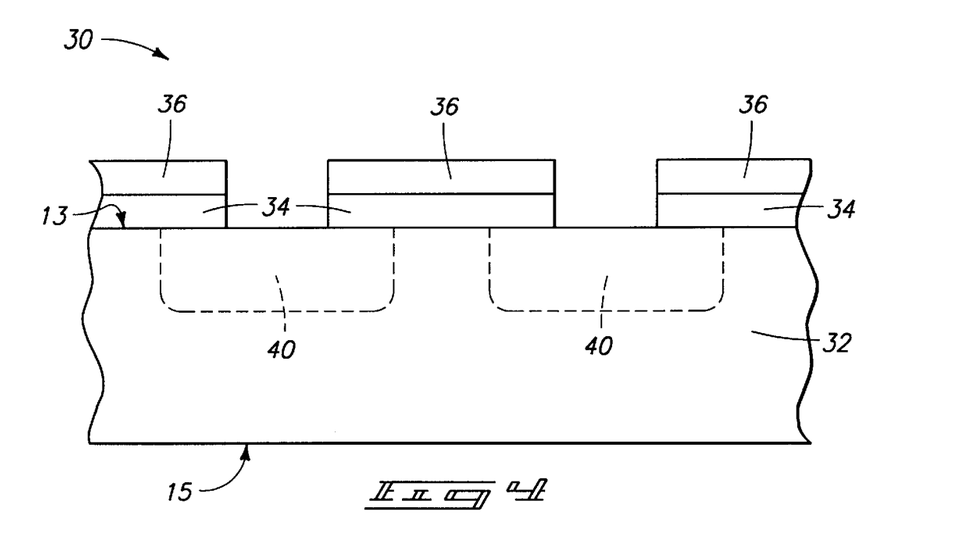
FIG. 4 is a view of the FIG. 2 wafer fragment at a processing step subsequent to that of FIG. 3.

Referring to FIG. 4, wafer fragment 30 is subjected to thermal processing to diffuse dopant 38 within substrate 32, and to thereby expand first regions 40. Dopant regions 40 are preferably processed for a sufficient time and temperature to expand the regions to a distance of about one-half the size of a feature which is to be formed from a stencil mask produced by the present invention. For instance, if a stencil mask produced from semiconductive wafer 30 is to be utilized in a 4x reduction process, 400 nanometer-wide openings in the mask will produce 100 nanometer-wide features on a wafer processed with the mask. In such circumstance, the first regions 40 will preferably be expanded to extend a distance of at least about 200 nanometers beyond a periphery of the 400 nanometer-wide opening formed in wafer fragment 30. Example thermal processing conditions are a temperature of about 1000° C., for a time of from about 30 minutes to about 60 minutes, for the dopant boron. Generally, wafer fragment 30 will be thermally processed to extend first regions 40 to at least about 50 nanometers beyond edges of openings formed in substrate 32.

Figure 5:
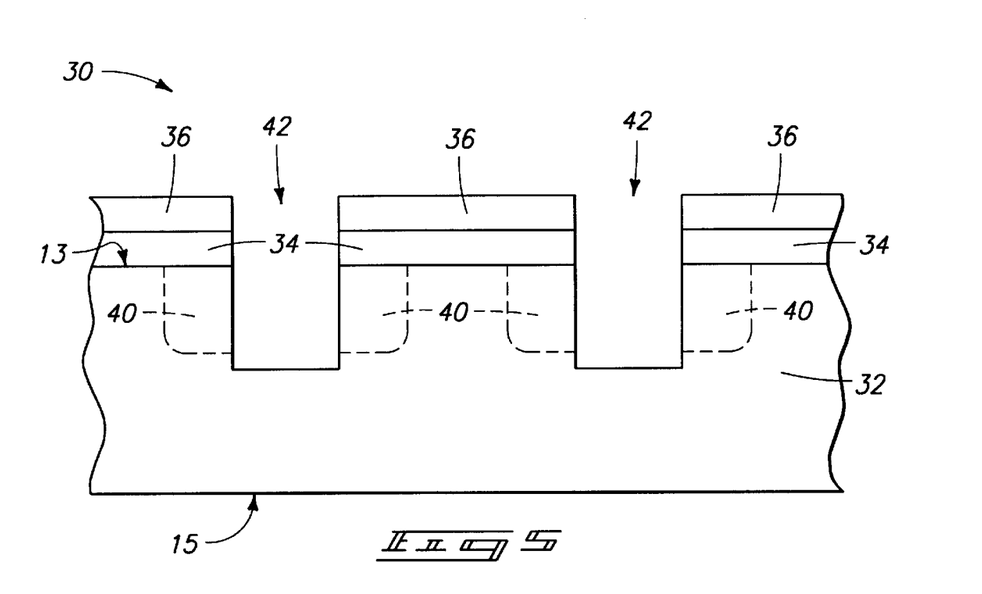
FIG. 5 is a view of the FIG. 2 wafer fragment at a processing step subsequent to that of FIG. 4.

Referring to FIG. 5, exposed portions of substrate 32 are removed to form openings 42 extending into substrate 32. In an example process in which substrate 32 comprises monocrystalline silicon, openings 42 can be formed by, for example, an anisotropic etch utilizing HBr and/or Cl$_2$.

Figure 6:
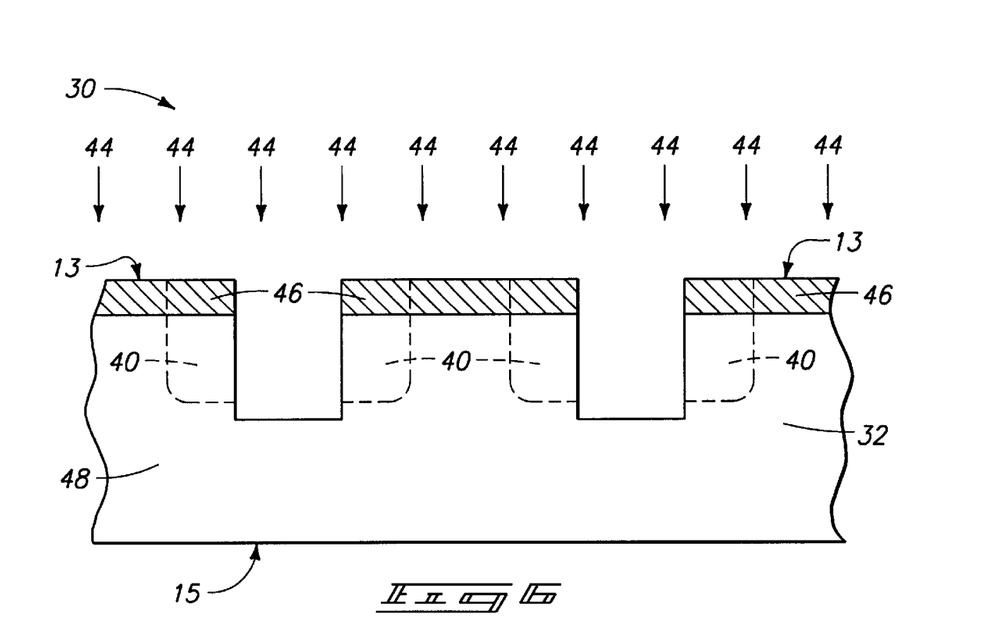
FIG. 6 is a view of the FIG. 2 wafer fragment at a processing step subsequent to that of FIG. 5.

Referring to FIG. 6, layers 34 and 36 are removed from over substrate 32 and an n-type dopant 44 is subsequently implanted into top surface 13 of substrate 32 to form an n-type doped region 46 within substrate 32. Doped region 46 defines an upper portion of substrate 32. Substrate 32 further comprises a lower portion 48 extending from n-type doped upper portion 46 to bottom surface 15. In embodiments in which substrate 32 comprises monocrystalline silicon lightly doped with a p-type dopant, lower portion 48 will be substantially uniformly doped with a p-type dopant and will thus comprise a p-type doped region. Preferably, dopant locations 40 will comprise an overwhelming amount of p-type dopant, such that an entirety of lower portion 48 is a p-type region. When an entirety of lower portion 48 is a p-type doped region, and an entirety of upper portion 46 is an n-type doped region, lower portion 48 can be selectively removed from substrate 32 by electrochemical etching. An example electrochemical etching process is described in U.S. patent application Ser. No. 08/916,818, which was filed on Aug. 22, 1997, and which is assigned to Micron Technology, Inc. U.S. patent application Ser. No. 08/916,818 is hereby incorporated by reference.

Figure 7:
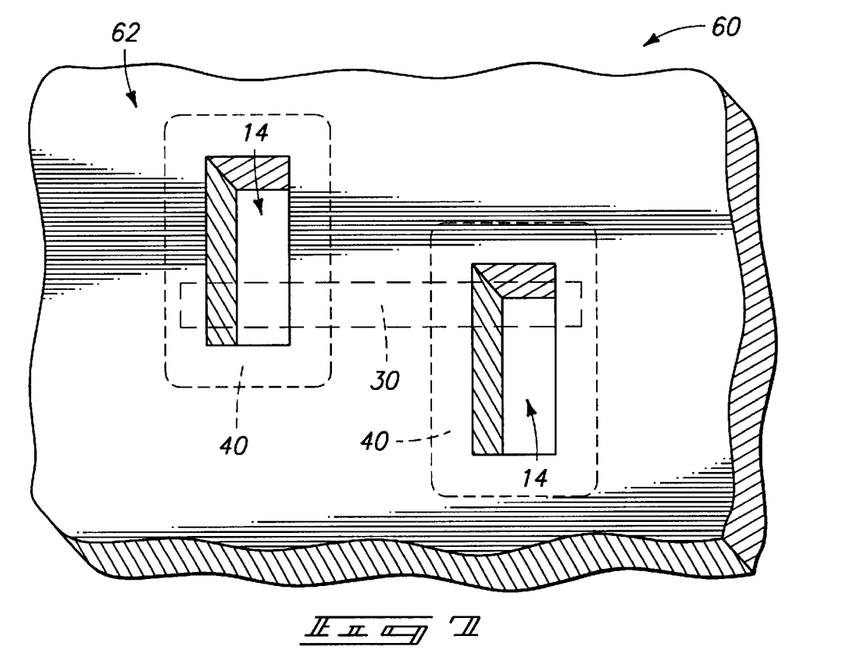
FIG. 7 is an isometric view of a stencil mask resulting from the processing steps of FIGS. 2–6.

A stencil mask 60, resulting after removal of lower portion 48 from substrate 32, is shown in FIG. 7 in a different fragmentary view from that used to illustrate the processing steps of FIGS. 2–6. A dashed line labeled "30" illustrates the location of semiconductor wafer fragment 30 (FIGS. 2–6) relative to stencil mask fragment 60. Stencil mask 60 has a pattern 62 of dopant comprising first locations defined by doped regions 40, and second locations between doped regions 40.

Although in the shown embodiment n-type doped regions 46 are formed after forming doped regions 40, and after forming openings 42, it is to be understood that the invention also encompasses methods in which the relative orders of forming regions 40 and 46, and openings 42 are altered relative to that shown. For instance, n-type regions 46 can be formed before forming doped regions 40 and openings 42. Also, openings 42 can be formed before forming either of doped regions 40 and 46. If openings 42 are formed before forming doped regions 40, doped regions 40 can be formed by, for example, an angled implant beneath masking layer 34 (FIG. 5).

Figure 8:
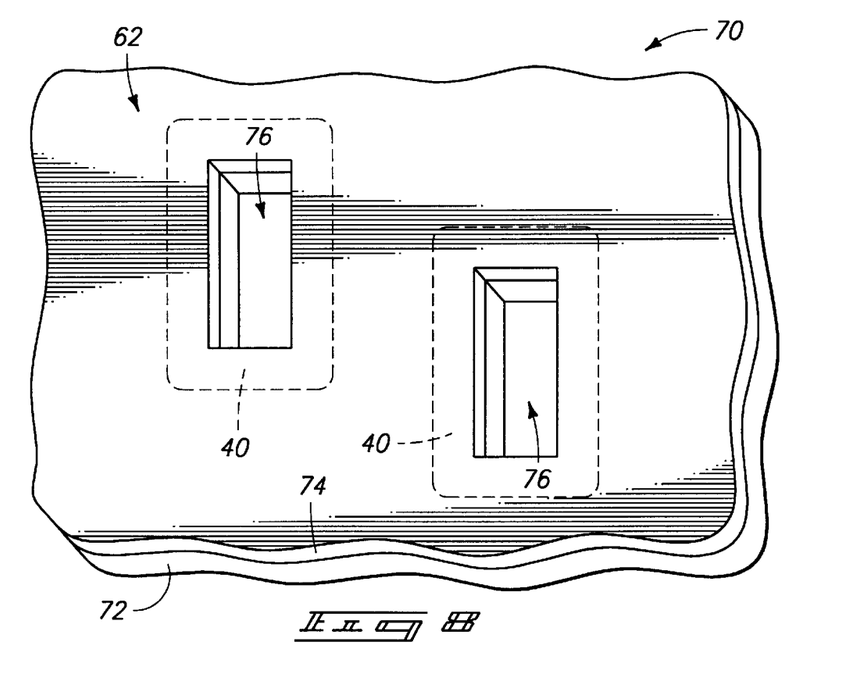
FIG. 8 is a fragmentary, isometric view of a stencil mask formed in accordance with a second embodiment of the present invention.

An second embodiment method of the present invention is described with reference to FIGS. 8 and 9, with FIG. 8 illustrating a stencil mask substrate fragment 70 at a preliminary processing step. Stencil mask fragment 70 comprises a substrate 72 having a patterned photoresist layer 74 formed thereon. Substrate 72 preferably comprises a semiconductive material, such as, for example, monocrystalline silicon.

Patterned photoresist layer 74 defines opening locations within substrate 72, and openings 76 are formed through substrate 72 at such locations.

Figure 9:
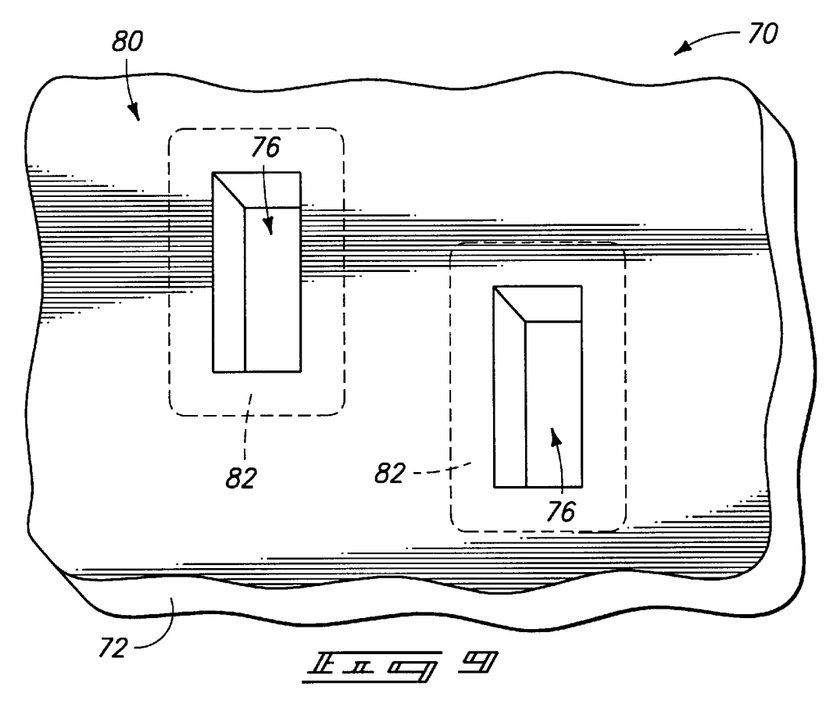
FIG. 9 is a view of the FIG. 8 wafer fragment at a processing step subsequent to that of FIG. 8.

Referring to FIG. 9, photoresist layer 74 (FIG. 8) is removed, and a dopant pattern 80 is provided within substrate 72. Dopant pattern 80 comprises first locations 82 surrounding openings 76 and second locations between first locations 82. First locations 82 have a dopant provided to a concentration, and the second locations do not have the dopant provided to the concentration.

Dopant pattern 80 can be formed by a number of methods, including, for example, an angled implant of a dopant into openings 76 while photoresist layer 74 remains over substrate 72. Another example method of forming dopant pattern 80 includes stripping photoresist layer 74 from over substrate 70, providing a second photoresist layer over the substrate which is patterned to expose regions of substrate 72 corresponding to first locations 82, and providing a dopant within such exposed regions. The dopant can be provided by, for example, implanting, gas phase doping, or spin-on doping. In spin-on doping, a liquid layer comprising dopant, and, for example, siloxane, would be provided over substrate 72. The liquid would then be solidified, and thermally treated to diffuse dopant from the solidified layer into exposed portions of substrate 72. The solidified layer could then be stripped from over substrate 72. After the dopant is provided within substrate 12, the dopant can be further diffused within substrate 72 by thermal processing to expand dopant locations 82.

Although the various doping methods of angled implants, spin-on doping, and gas phase doping where discussed with reference to the second embodiment method of FIGS. 8–9, it is to be understood that any of such doping methods could also be utilized in conjunction with the first embodiment method of FIGS. 2–7.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of manufacturing a stencil mask comprising:
   defining a plurality of opening locations within a substrate;
   providing a dopant within the substrate, the dopant being provided in a pattern to a concentration to form a plurality of first regions comprising the dopant to the concentration and one or more second regions which do not comprise the dopant to the concentration, individual first regions surrounding individual opening locations and the dopant having a conductivity type the same as a background dopant, if any, provided in the substrate;
   forming a plurality of openings within the opening locations, the individual openings extending into the substrate;
   providing an additional dopant at least in the first regions, the additional dopant being different from the dopant; and
   forming a stencil mask from the substrate having the openings extending therein, the stencil mask comprising at least a portion of the first and second regions.

2. The method of claim 1 wherein the substrate comprises a semiconductive material.

3. The method of claim 1 wherein the concentration is at least about $10^{17}$ atoms/cm$^3$.

4. The method of claim 1 wherein the second regions comprise none of the dopant.

5. The method of claim 1 wherein the substrate comprises monocrystalline silicon.

6. The method of claim 1 wherein a plurality of different dopants are provided in the first regions.

7. The method of claim 1 wherein a plurality of different dopants are provided in the first regions and none of the different dopants are provided in the second regions.

8. A method of manufacturing a stencil mask comprising:
   defining a plurality of opening locations within a substrate;
   providing a dopant within the substrate, the dopant being provided in a pattern to a concentration to form a plurality of first regions comprising the dopant to the concentration and one or more second regions which do not comprise the dopant to the concentration, individual first regions surrounding individual opening locations and the dopant having a conductivity type the same as a background dopant, if any, provided in the substrate;
   forming a plurality of openings within the opening locations before the providing the dopant, the individual openings extending into the substrate; and
   forming a stencil mask from the substrate having the openings extending therein, the stencil mask comprising at least a portion of the first and second regions.

9. The method of claim 1 wherein forming the openings occurs after the providing the dopant.

10. The method of claim 1 wherein the substrate comprises a material, and wherein the dopant has an atomic radii bigger than an atomic radii of the material.

11. The method of claim 1 wherein the substrate comprises a material, and wherein the dopant has an atomic radii smaller than an atomic radii of the material of the substrate.

12. A method of manufacturing a stencil mask from a semiconductive material comprising:
   forming a patterned material over the semiconductive material, the patterned material covering portions of the semiconductive material and leaving other portions uncovered;

providing a dopant into the uncovered portions of the semiconductive material and driving the dopant beneath the patterned material, the dopant having a conductivity type the same as a background dopant, if any, provided in the semiconductive material, removing the uncovered portions of the semiconductive material to form openings extending into the semiconductive material; and forming a stencil mask from the semiconductive material having the openings extending therein.

13. The method of claim 12 wherein the providing the dopant comprises:

forming a liquid layer comprising the dopant on the semiconductive material;

solidifying the liquid layer; and diffusing dopant from the solidified layer into the semiconductive material.

14. The method of claim 12 wherein the providing the dopant comprises gas phase doping.

15. The method of claim 12 wherein the providing the dopant and driving the dopant are together comprised by an angled implant.

16. The method of claim 12 wherein the driving the dopant comprises a thermal treatment of the semiconductive material to diffuse the dopant within the semiconductive material.

17. The method of claim 12 wherein the removing occurs before the providing the dopant.

18. The method of claim 12 wherein the removing occurs after the providing the dopant.

19. The method of claim 12 wherein the patterned material comprises a layer of photoresist.

20. The method of claim 12 wherein the patterned material comprises a layer of silicon dioxide.

21. The method of claim 12 wherein the patterned material comprises a layer of silicon dioxide and a layer of photoresist.

22. The method of claim 12 further comprising removing the patterned material from over the semiconductive material.

23. A method of manufacturing a stencil mask from a semiconductive material comprising:

forming a patterned material over the semiconductive material, the patterned material covering portions of the semiconductive material and leaving other portions uncovered;

providing a first dopant into the uncovered portions of the semiconductive material and driving the first dopant beneath the patterned material, the dopant having a conductivity type the same as a background dopant, if any, provided in the semiconductive material, removing the uncovered portions of the semiconductive material to form at least some openings extending into, but not through, the semiconductive material; and removing additional semiconductive material until said openings extend entirely through the semiconductive material, the semiconductive material having openings extending entirely therethrough being a stencil mask.

24. The method of claim 23 wherein the patterned material comprises a layer of photoresist.

25. The method of claim 23 wherein the patterned material comprises a layer of silicon dioxide.

26. The method of claim 23 further comprising removing the patterned material from over the semiconductive material.

27. The method of claim 23 wherein the semiconductive material comprises a top surface and a bottom surface, and wherein the patterned material is formed on the top surface, the method further comprising:

providing a second dopant at the top surface and within an upper portion of the semiconductive material, the second dopant being an n-type dopant and being provided uniformly throughout an entirety of the upper region of the semiconductive material, the portion of the wafer doped with the second dopant comprising an n-type doped region;

providing a third dopant at the bottom surface and within a lower portion of the semiconductive material, the third dopant being a p-type dopant and being provided uniformly throughout an entirety of the lower portion of the semiconductive material, the portion of the wafer doped with the third dopant comprising a p-type doped region, the n-type doped region and p-type doped regions contacting one another within the semiconductive material; and removing the additional semiconductive material by electrochemically etching the semiconductive material to remove the p-type doped region.

28. The method of claim 27 further comprising removing the patterned material from over the semiconductive material prior to the electrochemical etching.

29. A stencil mask comprising:

a semiconductive material substrate;

a plurality of openings extending through the substrate;

a pattern of dopant within the substrate, the pattern comprising at least one first location doped to a concentration with a first dopant and at least one second location not doped to the concentration with the first dopant, the at least one first location surrounding individual openings and at least a portion of the first dopant having a conductivity type the same as a background dopant, if any, provided in the substrate; and a second dopant at least in the at least one first location, the second dopant being different from the first dopant.

30. A stencil mask comprising:

a substrate;

a plurality of openings extending through the substrate;

a pattern of dopant within the substrate, the pattern comprising a plurality of first locations doped to a concentration with a dopant and one or more second locations not doped to the concentration with the dopant, individual first locations surrounding individual openings and at least a portion of the dopant having a conductivity type the same as a background dopant, if any, provided in the substrate; and an additional dopant at least in the first locations, the additional dopant being different from the dopant of the pattern of dopant.

31. The stencil mask of claim 30 wherein the substrate comprises a semiconductive material.

32. The stencil mask of claim 30 wherein the substrate comprises monocrystalline silicon.

33. The stencil mask of claim 30 wherein all of the individual openings of the plurality of openings are surrounded by individual first locations.

34. The stencil mask of claim 30 wherein the dopant of the pattern of dopant comprises an atomic radii smaller than an atomic radii of the substrate.

35. The stencil mask of claim 30 wherein the dopant of the pattern of dopant comprises an atomic radii larger than an atomic radii of the substrate.

36. The stencil mask of claim 30 wherein the pattern of dopant comprises at least two different dopants, a first of the at least two dopants having an atomic radii larger than an atomic radii of the substrate, and a second of the at least two dopants having an atomic radii smaller than an atomic radii of the semiconductive material.

37. The stencil mask of claim 30 wherein the dopant of the pattern of dopant comprises a p-type dopant.

38. The stencil mask of claim 30 wherein the dopant of the pattern of dopant comprises an n-type dopant.

39. The stencil mask of claim 30 wherein the dopant of the pattern of dopant comprises a p-type dopant and the additional dopant comprises a n-type dopant.

40. The stencil mask of claim 30 wherein the dopant of the pattern of dopant comprises boron.

41. The stencil mask of claim 30 wherein the dopant of the pattern of dopant comprises phosphorus.

42. The stencil mask of claim 30 wherein the dopant of the pattern of dopant comprises boron and the additional dopant comprises phosphorus.

43. The stencil mask of claim 30 wherein the second locations do not comprise the dopant of the pattern of dopant, the additional dopant being formed substantially uniformly throughout the stencil mask.

44. The stencil mask of claim 30 wherein the second locations do not comprise either the dopant of the pattern of dopant or the additional dopant.

45. The stencil mask of claim 30 wherein the second locations do not comprise either the dopant of the pattern of dopant or the additional dopant, the stencil mask further comprising a background dopant formed substantially uniformly throughout the stencil mask.

\* \* \* \* \*

UNITED STATES PATENT AND TRADEMARK OFFICE
CERTIFICATE OF CORRECTION

PATENT NO.    : 6,300,017 B1
DATED         : October 9, 2001
INVENTOR(S)   : J. Brett Rolfson and Ivan L. Berry, III It is certified that error appears in the above-identified patent and that said Letters Patent is hereby corrected as shown below:

<u>Drawings,</u>
Delete Figure 8, and substitute therefor the Figure 8, as shown on the attached pages Signed and Sealed this Seventeenth Day of September, 2002

Attest:

Attesting Officer

JAMES E. ROGAN
Director of the United States Patent and Trademark Office